US009972649B2

(12) United States Patent
Spanoudaki et al.

(10) Patent No.: US 9,972,649 B2
(45) Date of Patent: May 15, 2018

(54) NANOWIRE FET IMAGING SYSTEM AND RELATED TECHNIQUES

(71) Applicant: Massachusetts Institute of Technology, Cambridge, MA (US)

(72) Inventors: Virginia Spanoudaki, Cambridge, MA (US); Daniel G. Anderson, Sudbury, MA (US); Robert S. Langer, Newton, MA (US)

(*) Notice: Subject to any disclaimer, the term of this patent is extended or adjusted under 35 U.S.C. 154(b) by 0 days. days.

(21) Appl. No.: 15/294,914

(22) Filed: Oct. 17, 2016

(65) Prior Publication Data
US 2017/0117312 A1   Apr. 27, 2017

Related U.S. Application Data

(60) Provisional application No. 62/244,471, filed on Oct. 21, 2015.

(51) Int. Cl.
*H01L 27/146* (2006.01)
*H01L 29/06* (2006.01)

(52) U.S. Cl.
CPC .. *H01L 27/14616* (2013.01); *H01L 27/14605* (2013.01); *H01L 27/14636* (2013.01); *H01L 29/0669* (2013.01)

(58) Field of Classification Search
CPC ......... H01L 27/14616; H01L 27/14605; H01L 27/14636; H01L 29/0669
See application file for complete search history.

(56) References Cited

U.S. PATENT DOCUMENTS 3,452,256 A * 6/1969 Clarke .................. H01L 27/00
257/205
3,453,507 A * 7/1969 Archer .................. H01L 27/098
148/DIG. 120
(Continued)

FOREIGN PATENT DOCUMENTS

WO   WO 2008/153552 A1   12/2008
WO   WO 2014/058473 A1   4/2014
(Continued)

OTHER PUBLICATIONS

PCT International Search Report and Written Opinion dated Jan. 17, 2017 for International Application No. PCT/US2016/057275; 15 pages.
(Continued)

*Primary Examiner* — Christine Sung
(74) *Attorney, Agent, or Firm* — Daly, Crowley, Mofford & Durkee, LLP (57) ABSTRACT

A sensor comprises a substrate; an array of nanowire field effect transistors (NWFETs) formed in said substrate, each of the NWFETs having source, drain and gate terminals; a nanowire coupled between the source terminal and the drain terminal of each NWFET; and a layer of radiation sensitive material disposed over said NWFETs and said nanowires with each of the source, drain and gate terminals configured to be coupled to respective ones of first, second or third reference potentials, wherein each NWFET is configured such that the conductivity between the source and drain changes in response to radiation absorbed in the layer of radiation sensitive material such that the sensor generates an output signal in response to radiation absorbed by the radiation sensitive material.

19 Claims, 8 Drawing Sheets

(56) References Cited

U.S. PATENT DOCUMENTS

| | | | |
|---|---|---|---|
| 4,636,825 A * | 1/1987 | Baynes | H01L 29/0843 257/401 |
| 5,262,649 A | 11/1993 | Antonuk et al. | |
| 5,273,910 A | 12/1993 | Tran et al. | |
| 6,859,232 B1 * | 2/2005 | Tonami | G01T 1/2928 250/370.09 |
| 7,129,554 B2 | 10/2006 | Lieber et al. | |
| 7,923,240 B2 | 4/2011 | Su | |
| 8,097,926 B2 | 1/2012 | de Graff et al. | |
| 8,110,883 B2 * | 2/2012 | Ward | G01J 5/02 257/428 |
| 8,372,726 B2 | 2/2013 | de Graff et al. | |
| 8,389,862 B2 | 3/2013 | Arora et al. | |
| 8,426,208 B2 | 4/2013 | Swager et al. | |
| 8,536,667 B2 | 9/2013 | de Graff et al. | |
| 8,886,334 B2 | 11/2014 | Ghaffari et al. | |
| 8,889,455 B2 | 11/2014 | Duane et al. | |
| 8,951,473 B2 | 2/2015 | Wang et al. | |
| 2009/0014757 A1 * | 1/2009 | Takulapalli | G01N 27/4145 257/253 |
| 2010/0087782 A1 | 4/2010 | Ghaffari et al. | |
| 2010/0297608 A1 | 11/2010 | Stern et al. | |
| 2010/0330687 A1 * | 12/2010 | Afzali-Ardakani | B82Y 10/00 436/149 |
| 2011/0215931 A1 | 9/2011 | Callsen et al. | |
| 2011/0218756 A1 | 9/2011 | Callsen et al. | |
| 2011/0218757 A1 | 9/2011 | Callsen et al. | |
| 2012/0028820 A1 * | 2/2012 | Rhodes | B82Y 15/00 506/9 |
| 2012/0065937 A1 | 3/2012 | de Graff et al. | |
| 2012/0092178 A1 | 4/2012 | Callsen et al. | |
| 2012/0156833 A1 * | 6/2012 | Kawashima | H01L 29/0673 438/151 |
| 2012/0244848 A1 | 9/2012 | Ghaffari et al. | |
| 2013/0099358 A1 | 4/2013 | Elolampi et al. | |
| 2013/0150693 A1 | 6/2013 | D'Angelo et al. | |
| 2013/0185003 A1 | 7/2013 | Carbeck et al. | |
| 2013/0192356 A1 | 8/2013 | de Graff et al. | |
| 2013/0200268 A1 | 8/2013 | Rafferty et al. | |
| 2013/0225965 A1 | 8/2013 | Ghaffari et al. | |
| 2013/0245388 A1 | 9/2013 | Rafferty et al. | |
| 2013/0274562 A1 | 10/2013 | Ghaffari et al. | |
| 2013/0313713 A1 | 11/2013 | Arora et al. | |
| 2013/0316487 A1 | 11/2013 | de Graff et al. | |
| 2013/0337567 A1 * | 12/2013 | Shin | G01N 27/4146 436/63 |
| 2014/0001058 A1 | 1/2014 | Ghaffari et al. | |
| 2014/0012160 A1 | 1/2014 | Ghaffari et al. | |
| 2014/0012242 A1 | 1/2014 | Lee et al. | |
| 2014/0022746 A1 | 1/2014 | Hsu | |
| 2014/0034907 A1 | 2/2014 | Lee et al. | |
| 2014/0039290 A1 | 2/2014 | de Graff et al. | |
| 2014/0097944 A1 | 4/2014 | Fastert et al. | |
| 2014/0110859 A1 | 4/2014 | Rafferty et al. | |
| 2014/0188426 A1 | 7/2014 | Fastert et al. | |
| 2014/0232841 A1 | 8/2014 | Ohta et al. | |
| 2014/0240932 A1 | 8/2014 | Hsu | |
| 2014/0249520 A1 | 9/2014 | Ghaffari et al. | |
| 2014/0303452 A1 | 10/2014 | Ghaffari et al. | |
| 2014/0340857 A1 | 11/2014 | Hsu et al. | |
| 2014/0375465 A1 | 12/2014 | Fenuccio et al. | |
| 2015/0019135 A1 | 1/2015 | Kacyvenski et al. | |
| 2015/0034834 A1 * | 2/2015 | Afzali-Ardakani | H01L 31/085 250/370.14 |
| 2015/0035680 A1 | 2/2015 | Li et al. | |
| 2016/0041155 A1 * | 2/2016 | Takulapalli | G01N 27/4145 506/16 |

FOREIGN PATENT DOCUMENTS

| | | |
|---|---|---|
| WO | WO 2014/059032 A1 | 4/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |

OTHER PUBLICATIONS

Tang et al., "Measurement of Ionizing Radiation using Carbon Nanotube Field Effect Transistor;" Institute of Physics Publishing, Physics in Medicine and Biology; vol. 50; Jan. 19, 2005; 9 pages.

Cui et al., "High Performance Silicon Nanowire Field Effect Transistors;" Nano Letters, vol. 3, No. 2; Nov. 1, 2002; 4 pages.

Kuo, "Thin Film Transistor Technology—Past, Present, and Future;" The Electrochemical Society Interface; Jun. 20, 2013; 7 pages.

Wang et al., "Opportunities and Challenges in Application-Tuned Circuits and Architectures Based on Nanodevices;" ACM First Conference on Computing Frontiers, vol. CF'04; Apr. 16, 2004; 9 pages.

Takahashi et al., "Carbon Nanotube Active-Matrix Backplanes for Mechanically Flexible Visible Light and X-ray Imagers;" Nano Letters, vol. 13, No. 11; Nov. 13, 2013; 6 pages.

Foxe et al., "Detection of Ionizing Radiation Using Graphene Field Effect Transistors;" Proceedings of the IEEE; Manuscript Received Nov. 13, 2009; 6 Pages.

Gandhi et al., "Cadmium Zinc Telluride (CZT) Nanowire Sensors for Detection of Low Energy Gamma-Ray Detection;" Micro (MEMS) and Nanotechnologies for Space, Defense, and Security II; Proceedings of SPIE, vol. 6959, 695904-1; 2008; 13 Pages.

Hayden et al., "Nanoscale Avalanche Photodiodes for Highly Sensitive and Spatially Resolved Photon Detection;" Nature Materials, vol. 5; May 2006; 5 Pages.

Lobez et al., "Radiation Detection: Resistivity Responses in Functional Poly(Olefin Sulfone)/Carbon Nanotube Composites;" Angewandte Chemie International Edition 2010, vol. 49; Jan. 4, 2010; pp. 95-98; 4 Pages.

Romeo et al., "Nanowire-based Field Effect Transistors for Terahertz Detection and Imaging Systems;" *Nanotechnology*, vol. 24, No. 21; Apr. 25, 2013; 8 Pages.

Stern et al., "Label-free Immunodetection with CMOS-Compatible Semiconducting Nanowires;" Nature, www.nature.com/nature, vol. 445; Feb. 1, 2007; 4 Pages.

Stern et al., "Supplementary Information: Label-Free Immunodetection with CMOS-Compatible Semiconducting Nanowires;" Nature, www.nature.com/nature; vol. 445; Feb. 1, 2007; 18 Pages.

Tang et al., "Measurement of Ionizing Radiation Using Carbon Nanotube Field Effect Transistor;" Physics in Medicine and Biology, vol. 50; Feb. 7, 2005; pp. N23-N31; 9 Pages.

Spanoudaki, "Towards Small Scale Integration of Imaging Technologies (MIT/Harvard);" PowerPoint Presentation; Presented Apr. 9, 2015; 3 Pages.

* cited by examiner

NANOWIRE FET IMAGING SYSTEM AND RELATED TECHNIQUES

CROSS REFERENCE TO RELATED APPLICATION

This application claims the benefit under 35 U.S.C. § 119(e) of U.S. Provisional Application No. 62/244,471 filed Oct. 21, 2015, which application is incorporated herein by reference in its entirety.

STATEMENT REGARDING FEDERALLY SPONSORED RESEARCH

This invention was made with Government support under Grant No. R01 DE016516 awarded by the National Institutes of Health. The Government has certain rights in the invention.

BACKGROUND

As is known in the art, diagnostically relevant particles and rays, such as products of radioactive decay (i.e., beta particles and gamma rays), or x-rays resulting from an x-ray tube, can be detected with a variety of instrumentation the sensitivity of which typically depends on some type of energy width characteristic to the detector material. This characteristic energy width is related to the energy bandgap and, in the case of semiconductors, to the energy levels of dopants in the case of scintillation and other luminescence materials, and to the ionization energies in the case of gas detectors. The energy width also determines the internal amplification factor for detection, which may be defined as the number of signal carriers (e.g., visible photons in the case of scintillators, electrons or holes in the case of semiconductors, and ions in the case of gas detectors) per absorbed energy of the detected entity.

In the case of high energy photons with energies equal or above the energy regime of x-rays, are typically detected using a dual-step conversion of the high energy photons to visible light by means of a scintillation crystal and of the visible light to electrical charge by means of a photodetector. This two-step conversion (wherein each step may have its own internal amplification requirements) typically leads to loss of information and also adds complexity in the detector design. Although a number of existing detector designs use materials that allow for a one-step radiation detection (e.g., Germanium, Cadmium Telluride or Cadmium Zinc Telluride devices which are semiconductors with high enough atomic number and density and low enough bandgap to be sensitive to high energy radiation), their sensitive operation relies upon strong internal and external amplification of the generated charge, in order for the latter to be accurately detected.

It would, therefore, be desirable to provide a one step radiation detection system for detection of a wide range of radiation wavelengths, and for different types of radiation, both charged and neutral, where the need for internal amplification of the generated signal carriers is less of a requirement.

SUMMARY

Described herein are concepts, circuits, systems and techniques related to a radiation sensor in which charge generated upon absorption of radiation incident upon a radiation sensitive material induces an electrical response in one or more nanowire (NW) field effect transistors (FETs).

According to one aspect of the disclosure, a sensor comprises: a substrate; an array of nanowire field effect transistors (NWFETs) formed in said substrate, each of the NWFETs having source, drain and gate terminals; a nanowire coupled between the source terminal and the drain terminal of each NWFET; a thin insulating material covering the nanowire surface and a layer of radiation sensitive material disposed over said NWFETs and said nanowires with each of the source, drain and gate terminals configured to be coupled to respective ones of first, second or third reference potentials, wherein each NWFET is configured such that the conductivity between the source and drain changes in response to radiation absorbed in the layer of radiation sensitive material such that the sensor generates an output signal in response to radiation absorbed by the radiation sensitive material.

In some embodiments, each NWFET in the array of NWFETs is coupled to at least one other NWFET in the array of NWFETs. In certain embodiments, at least one of the NWFETs in said array of NWFETs includes a drain terminal coupled to a source terminal of at least one other NWFET in said array of NWFETs.

In particular embodiments, the radiation sensitive material is provided as one of: materials sensitive to gamma rays; materials sensitive to x-rays; materials sensitive to charged particles; a material having a relatively high atomic number and a relatively high density; a material having a relatively high relative dielectric constant ($\in_r$) and a relatively high density; titanium oxide (TiO); titanium dioxide (TiO$_2$); dititanium trioxide (Ti$_2$O$_3$); lead zirconate titanate (Pb[Zr$_x$Ti$_{1-x}$]O$_3$ (0≤x≤1); bismuth (Bi); lead (Pb); gold; tungsten; platinum; and germanium; and scintillation materials.

In some embodiments, the nanowire in the NWFET is provided having a diameter in the range of about 2 nanometers to about 500 nm and a length in the range of about 0.5 micron to about 30 microns, with a range of about 1 to about 20 microns being preferred.

In certain embodiments, a voltage input terminal and a ground terminal, wherein the drain terminal of each of the NWFETs include is coupled to the voltage input terminal and the source terminal of at least some of the NWFETs is coupled to the ground terminal. In many embodiments, the nanowires of said array of NWFETs are disposed so as to form a rectangular grid pattern. In some embodiments, the nanowires of said array of NWFETs are disposed horizontally, vertically, and diagonally. In one embodiment, the array of nanowire FETs are provided in a radial pattern. In particular embodiments, the substrate is flexible.

In some embodiments, the layer of radiation sensitive material corresponds to a first layer of radiation sensitive material and the array of NWFETs corresponds to a first array of NWFETs and wherein the sensor further comprises a second layer of radiation sensitive material and a second array of NWFETs with the first layer of radiation sensitive material and the first array of NWFETs disposed above the second layer of radiation sensitive material and the second array of NWFETs so as to form a stacked arrangement.

In particular embodiments, the sensor further comprises signal processing circuitry coupled to receive an output signal from the sensor.

The concepts, circuits, systems and techniques described herein find broad applicability in the medical imaging industry. Specifically the conceived detector can be used in imaging systems that are based upon the detection of radiation, such as autoradiography, positron emission tomography (PET), single photon emission computer tomography (SPECT), x-ray computer tomography (CT). In addition, the detector is appropriate for use in image guided intervention procedures such as biopsy and surgery. Both clinical and pre-clinical (e.g. small animal) applications are relevant. Other applications include high energy physics detectors, homeland security, and space exploration.

It should be appreciated that the circuits, systems and techniques described herein may include one or more of the described features independently or in combination with another feature and that elements of different embodiments described herein may be combined to form other embodiments which may not be specifically set forth herein.

According to another aspect of the disclosure, an imaging system comprises: a radiation sensor including an array of nanowire field effect transistors (FETs), each of the nanowire FETs having a layer of radiation sensitive material disposed thereover, and each of the nanowire FETs configured to generate an output signal in response radiation absorbed by the radiation sensitive material; and a signal processor coupled to said radiation sensor and configured to process the nanowire FET output signals to generate an image in response to radiation incident on the radiation sensitive material.

BRIEF DESCRIPTION OF THE DRAWINGS

The foregoing features may be more fully understood from the following description of the drawings in which.

DETAILED DESCRIPTION

Figure 1:
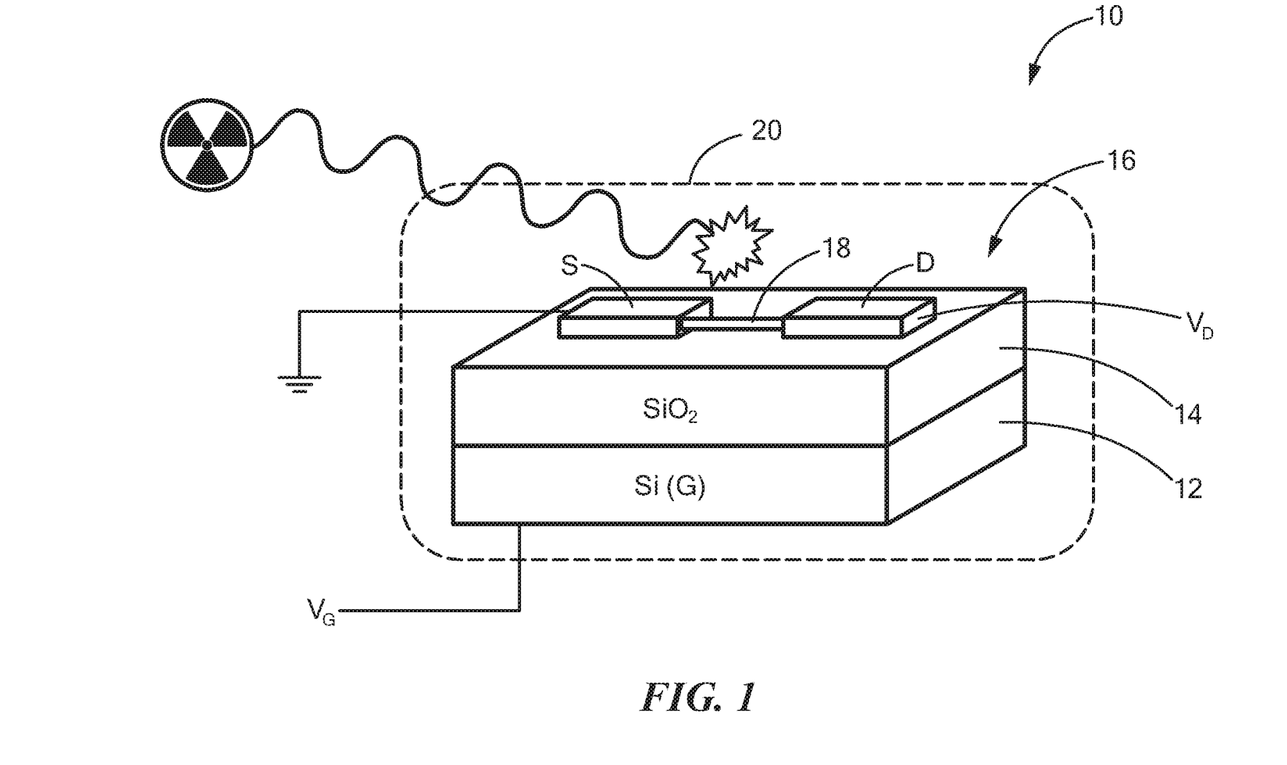
FIG. 1 is an isometric block diagram of a nanowire field effect transistor (NWFET) sensor element which may be appropriate for use in a radiation sensor of the type show in FIGS. 3-5.

Referring now to FIG. 1, a sensor element 10 comprises a substrate 12 (e.g. a silicon substrate) having an insulating layer 14 (e.g. silicon dioxide) disposed thereon and in which is provided a nanowire field effect transistor (NWFET) 16 having source (S), drain (D) and gate (G) terminals (or electrodes) as shown. It should be appreciated that in this illustrative embodiment, the gate terminal G of NWFET 14 can be provided on the backside or bottom of substrate 12 and thus is not visible in FIG. 1. Accordingly, the gate terminal is referred to as a so-called "backside gate" (or more simply "back gate"). A nanowire (NW) 18 is coupled between source and drain terminals S, D. The electrical channel (or NW) could be composed of a variety of semiconducting materials, such as silicon, or materials with an adjustable bandgap, such as graphene in the form of carbon nanotubes. The nanowire is covered by a thin layer of insulating material, such as silicon dioxide or hafnium oxide.

The sensor element embodiment of FIG. 1 shows the gate terminal located below the substrate. In other embodiments, the gate terminal may be located above the nanowire (i.e., in a "top gate" configuration). In certain embodiments, gate terminals may be located both above the nanowire and below the substrate. In these alternate embodiments, the top gate may be provided from the radiation absorbing material (if that material is conductive) or may be provided as an additional conductive layer on top of the radiation absorbing material.

A radiation sensitive material 20 (illustrated in phantom in FIG. 1) is disposed over and around the NWFET. The choice of the material 20 used may be selected based on the ability of the material to easily ionize (and thus create a minimal but adequate internal amplification of the signal carriers) and its ability to provide a large screening length for the electric field of the generated signal carriers. In some embodiments, the radiation sensitive material 20 may be characterized by a high atomic number and high density in order to facilitate the absorption of high energy incident gamma ray or x ray radiation either fully, via the photoelectric effect, or partially, via the Compton scatter effect. In some applications the radiation sensitive material is provided having a relatively high relative dielectric constant ($\in_r$). Appropriate materials from which to provide the radiation sensitive material include but are not limited to metals, low loss dielectric materials (depending on the frequency of the incident radiation), semiconductor materials with low free charge and a high dielectric constant, high k-dielectric materials, titanium oxide (TiO), Titanium dioxide a/k/a titanium(IV) oxide, ($TiO_2$) Titanium(III) oxide (dititanium trioxide), ($Ti_2O_3$), lead zirconate titanate ($Pb[Zr_xTi_{1-x}]O_3$ (0≤x≤1) also referred to as PZT), gold, platinum, tungsten, silver, and germanium. And still other materials may be materials having a relatively high atomic number and a relatively high density. Such materials may be advantageously used in the detection of gamma rays and x-rays, for example. Such materials include, but are not limited to Bismuth (Bi), lead (Pb), for example. Another family of materials which may also be used is gold (Au) which would be suitable for amplifying a detected signal particularly for the detection of charged species, such as electrons.

In general, the particular radiation sensitive material selected for use in a particular sensor element depends upon the particular type or types of particles sought to be detected (e.g. electrons, gamma rays, x-rays, other charge particles).

First, second and third reference potentials are coupled to respective ones of the source, drain and gate terminals of the NWFET. In this illustrative embodiment, the first reference potential corresponds to ground, the second reference potential corresponds to a drain voltage $V_D$ (i.e. a drain voltage) and the third reference potential corresponds to a gate voltage $V_G$ (i.e. a bias voltage). In some applications, an external gate voltage may be applied to the gate terminal while in other applications an external gate voltage may not be required. The selection of a particular gate voltage to use in a particular application depends, at least in part, upon specific properties of the FET, nanowires and substrates. For example, in the illustrative embodiment of FIG. 1, if the $SiO_2$ layer is relatively thick, the voltage applied to the gate terminal (i.e. the gate voltage $V_G$) may be greater than or less than 0 volts (V), but not equal to 0 V. On the other hand, if the $SiO_2$ is relatively thin, a gate voltage may not be needed (i.e. it may not be necessary to apply a gate voltage). Thus, the gate bias is selected based upon the details of the manufacturing techniques and characteristics of the materials used in the manufacture of a particular sensor. It is not necessary to set the three reference potentials to specific values so long as the potential difference between them is of fixed value. Such a configuration is of importance in certain wiring configurations, such as the configuration shown in FIG. 5 and described below in conjunction therewith. In the case of a dual gate design (both backgate and topgate) a fourth reference potential may be applied.

As is known, changing the voltage on the gate terminal changes the conductance of the FET (i.e. the resistance of the conductive channel between the source and the drain terminal changes). More generally, the conductivity of the NWFET in the sensor element 10 in a first bias state of the gate terminal is different than the conductivity of the NWFET in a second state. It should, of course, be appreciated that there exists a continuous range of conduction states (i.e. a continuous range of conductivity values) between the fully on and fully off states of the NWFET.

As will become apparent from the description provided herein, it has been found that the characteristics of the radiation sensitive material and the FET can be combined and exploited to detect radiation incident on the sensor element 10. In particular, it should be appreciated that the NWFET conductance is responsive to an amount of radiation absorbed by the layer of radiation sensitive material 20 (i.e. the NWFET conductance changes in response to an amount of radiation energy absorbed by the layer of radiation sensitive material). Thus, the amount of radiation energy absorbed by the layer of radiation sensitive material determines the amount of change in the conductivity characteristic of each NWFET.

In this way, the conductivity response of the NWFET to radiation incident on the sensor element provides desired information related to the energy level of the particular type of incident radiation (e.g. gamma rays, x-rays, etc. . . . ). In some embodiments, the conductivity response (or "state") of the NWFET is indicative of a specific feature of the radiation incident on the sensor.

It has been recognized that some combinations of nanowire diameter, length and material type may result in optimized response of NWFETs to different types of radiation in terms of their conductivities. Similarly, it has been recognized that some combinations of materials (radiation sensitive materials and/or substrate materials) may result in optimized response of NWFETs to different types of radiation in terms of their conductivities. Thus, some combinations of nanowire diameters, nanowire lengths, radiation sensitive materials and substrate materials may result in in optimized response of NWFETs to different types of radiation in terms of their conductivities than other combinations of nanowire diameters, nanowire lengths and materials.

With respect to the sizes of the nanowires, the lengths of the nanowires from which the NWFETs are provided may be in the submicron range. In one embodiment, the nanowire in the NWFET is provided having a diameter in the range of about 2 nanometers to about 500 nm and a length in the range of about 0.5 micron to about 30 microns. In some applications, a length in the range of about 1 to about 20 microns is preferred.

It should be appreciated that nanowires having different aspect ratios (i.e. a ratio of nanowire diameter to nanowire length) may be preferred in different applications. That is, some combinations of diameters and lengths may be preferred in one application (e.g. to enhance detection of x-rays) while a different combination of diameters and lengths may be preferred in a second different application (e.g. to enhance detection of gamma rays)).

Figure 2:
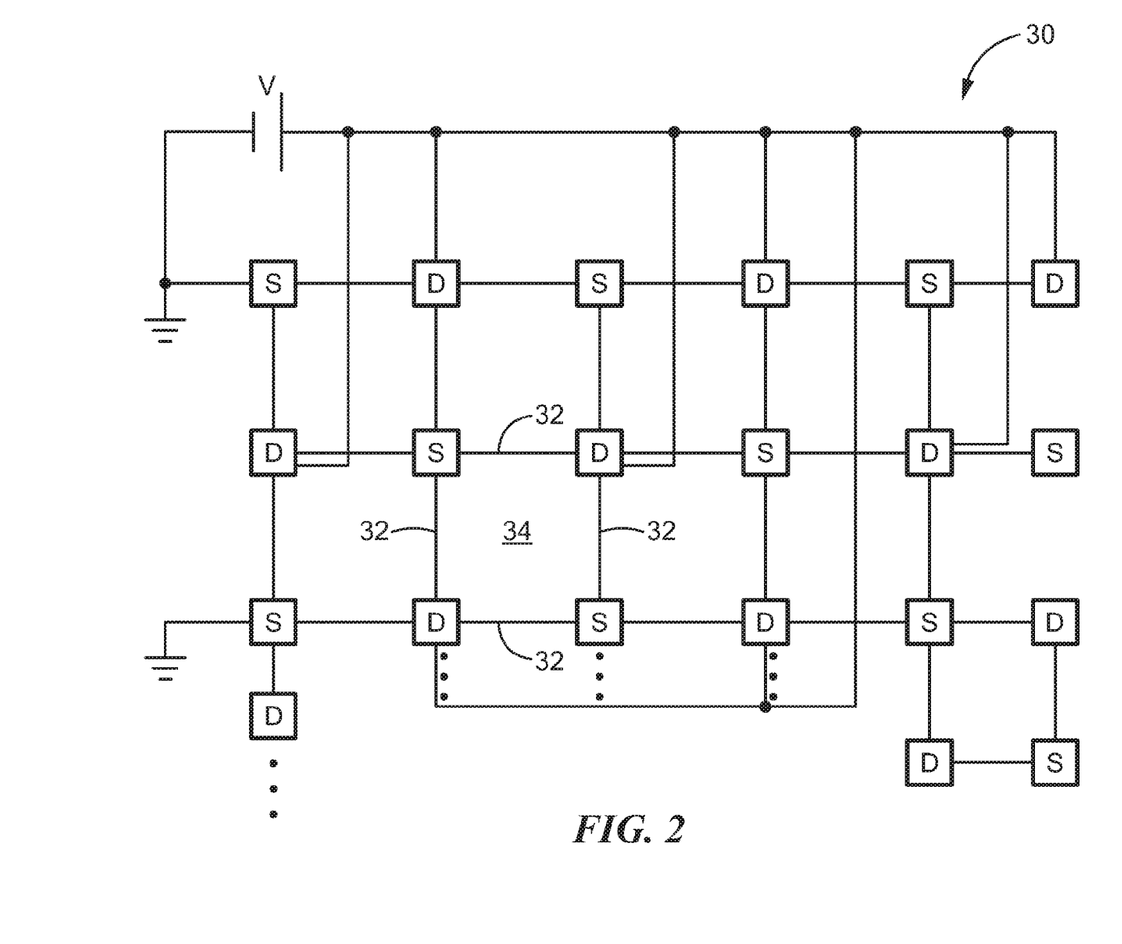
FIG. 2 is a schematic wiring diagram of an illustrative NWFET two-dimensional (2D) radiation sensor provided from a plurality of NWFET sensor elements.

Referring now to FIG. 2, an illustrative embodiment of a sensor 30 comprises an array of NWFET sensor elements which may be the same as or similar to the sensor element 10 described above in conjunction with FIG. 1. Each of the NWFETs is provided having source (S), drain (D) and gate (G) terminals. To promote clarity in the figure, the gate terminals and associated voltages are not shown nor is the radiation sensitive material explicitly shown in FIG. 3.

In the illustrative embodiment of FIG. 2, the source S and drain terminals D are disposed in a grid pattern, here a square grid pattern. Although the source and drain terminals are illustrated in a grid pattern, it should be appreciated that different patterns as well as different wiring configurations may also be used to suit the needs of a particular application. Thus, although in some embodiments the NWFETs comprising the sensor are arranged in a grid pattern (e.g. an X-Y grid pattern), the particular pattern in which to arrange the NWFETs, may of course, be selected in accordance with the needs of the particular application in which the sensor is used.

Nanowires 32 are coupled between the source and drain terminals. The NWFETs thus form a two-dimensional (2D) array (i.e. a planar array) to thus provide a 2D radiation sensor. The area enclosed between each set of four neighboring S and D terminals (and thus between four nanowires that have common S and D nodes) may be referred to as an "imaging pixel" (denoted 34 in the figure). To promote clarity in the figure, only four nanowires 32 and one imaging pixel 34 are labeled. In some embodiments, it may be desirable to use a linear array of sensor elements.

A first reference potential V, is coupled to drain terminals and a second reference potential, here corresponding to ground, is coupled to the source terminals. It should be appreciated that in this illustrative embodiment, source terminals S are coupled to a common ground, however, in order to promote clarity in the figure, not all source terminals are explicitly shown as being coupled to ground. It should be noted that for position localization purposes each NWFET within an imaging pixel should have a differing characteristic with respect to the remaining three. Examples of such characteristics include but are not limited to: Different doping profile (n- or p-type), or different reference potentials at the S and D terminals, or different baseline conductivities for each NW.

Although the radiation sensitive material is not explicitly shown in FIG. 2, it should be appreciated that radiation sensitive material is disposed over and around each of the nanowires filling up the imaging pixel area shown in FIG. 2. That is, the radiation sensitive material is disposed both on top of the nanowires and also fills the spaces between the nanowires such that radiation (e.g. sub-atomic particles) incident anywhere on the area of the imaging pixel is detected.

The radiation sensitive material, FETs and nanowires may be disposed or otherwise provided using a variety of techniques including additive and/or subtractive techniques. For example, the radiation sensitive material may be disposed or otherwise provided using a variety of techniques including additive techniques (e.g. any type of physical deposition techniques) including but not limited to thermal deposition techniques, any type of physical vapor deposition (PVD) techniques including but not limited to electron beam PVD, laser deposition techniques, sputter techniques as well as any type of chemical vapor deposition (CVD) techniques including but not limited to metal-organic chemical vapor phase deposition (MOCVD), as well as any type of growth techniques including but not limited to atomic layer deposition, molecular beam epitaxy (MBE).

It should also be appreciated that the nanowires may be provided using a variety of techniques including additive techniques and/or subtractive techniques including, but not limited to reactive ion etching (RIE) techniques or wet etching techniques. Thus, any technique capable of producing a desired pattern of nanowires having a desire aspect ratio may be used.

Those of ordinary skill in the art will appreciate how to select an appropriate technique from which to provide the radiation sensitive material. Such techniques are selected based upon a variety of factors including, but not limited to: the particular materials used for both the substrate and the radiation sensitive materials (and/or the availability of such materials), as well as the materials and techniques from which the FETs and nanowires are provided; interaction with diverse substrates; ease of processing; the desired characteristics of the resulting radiation layer (e.g. hardness); processing complexity; and/or the capability of arranging the nanowires into patterned structures appropriate for imaging (i.e. imaging pixels).

As noted above in conjunction with FIG. 1, the NWFET conductance is responsive to an amount of radiation energy absorbed by the layer of radiation sensitive material (i.e. NWFET conductance may change in response to an amount of radiation energy absorbed by the layer of radiation sensitive material). Thus, the conductivity of each of the responsive NWFETs in the array of NWFETs is different than the conductivity of each of the non-responsive NWFETs in the array of NWFETs.

As also noted above, the NWFETs are sensitive to an amount of radiation energy absorbed by the layer of radiation sensitive material. Thus, the amount of radiation absorbed by the layer of radiation sensitive material will determine the amount of change in the conductivity characteristic of each NWFET. It should, of course, be appreciated that there exists a continuous range of conductivity values (i.e. conduction states) between an NWFET biased to be fully "on" and an NWFET biased to be fully off (i.e. between ON and OFF states of each NWFET in the array).

In this way, the conductivity response of each NWFET provides desired information related to the energy level of the particular type of radiation (e.g. gamma rays, x-rays, etc. . . . ) incident on the radiation sensitive material. In some embodiments, the conductivity response (or each state) of the NWFET is indicative of a specific feature of the radiation intercepted by the sensor.

In operation of the 2D sensor, charge generated upon radiation incident upon the radiation sensitive material induces an electrical response in ones of the NWFETs comprising the sensor. Whenever a charge cloud is generated upon the absorption of radiation, the nodes of the NWFET array that are closer to the point of absorption will sense a higher charge density and thus will change their conductance. This change in conductance can be observed electrically as an induced increase or decrease in the electric current across each NWFET. Consequently, the position of the radiation absorption can be determined by which NWFETs have shown a change in their conductance. The accuracy of this position localization can be regulated by the distance between the NWFETs within the NWFET array.

Stated differently, those NWFETs proximate the region of the radiation sensitive material impacted by the radiation (and neighboring ones of such NWFETs) respond to the incident radiation. The position (and possibly other characteristics) of the charge is detected based upon the position and response characteristics of the NWFETs.

Figure 3:
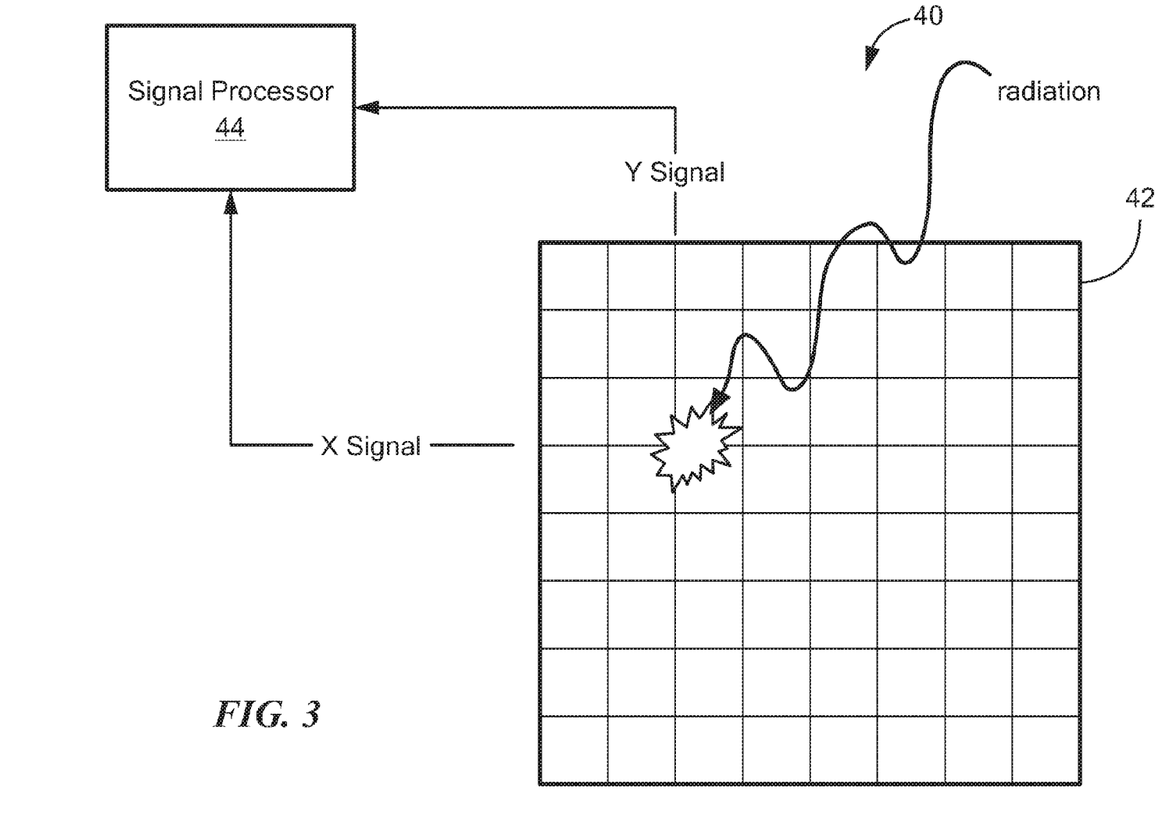
FIG. 3 is a schematic diagram of an image processing system provided from an NWFET 2D radiation sensor.

Referring now to FIG. 3, an imaging system 40 includes a sensor 42 provided from an array of NWFETS having a radiation sensitive material 43 disposed thereover. The NWFETs are disposed in a grid pattern and may each be the same as or similar to, the NWFETs described herein in conjunction with FIGS. 1, 2. The radiation sensitive material may be characterized by a high atomic number and high density and may also be the same as or similar to the radiation sensitive material described above in conjunction with FIGS. 1 and 2. In some embodiments, sensor 42 is the same as or similar to a sensor described herein in conjunction with FIGS. 2, 5, 7, and/or 8.

Signal processing circuitry 44 is coupled to sensor 42. As noted above, in response to radiation incident on the radiation sensitive material, an energetic electron will be generated, which in turn will create further ionizations resulting in a charge "cloud" 46 at the vicinity of the initial interaction event (i.e. the radiation incident upon the radiation sensitive material).

Whenever a charge cloud is generated upon the absorption of radiation, the nodes of the NWFET grid that are closer to the point of absorption will sense a higher charge density and thus will change their conductance. This change in conductance can be observed electrically as an induced increase or decrease in the current across each NWFET. The position of the radiation absorption can thus be determined by which NWFETs have shown a change in their conductance. The accuracy of this position localization can be regulated by the distance between the NWFETs within the NWFET grid. The above design can also be expanded for three-dimensional (3D) radiation detection as will be described in conjunction with FIG. 4.

Thus, NWFETs physically proximate the radiation impact region produce a response signal (here, an X signal and a Y signal) which is provided to the signal processing circuitry. The signal processing circuitry receives the signal(s) provided thereto from the sensor and appropriately processes the signal(s) (e.g. image generation via image generation software).

In some embodiments, the NWFETs may produce a response signal having a relatively low (or weak) signal strength. Thus, it is often desirable to amplify the response signal. Accordingly, signal processing circuitry may comprise an operation amplifier which improves a signal-to-noise ratio and otherwise prepares response signals provided thereto from sensor 42 for further processing.

The concepts, circuits, systems and techniques described herein eliminates secondary conversion steps, and strong internal amplification of the signal carriers required by the prior art approach. Thus, the concepts, circuits, systems and techniques described herein simplify the overall detector design. In addition, the requirements for amplification of the charge signal before it can be detected become less important due to the inherently high sensitivity of the NWFETs in charge detection, reaching levels observed in molecular interactions.

It should be appreciated that both sensor 42 and the signal processing circuitry 44 may be provided as an integrated circuit on a single semiconductor wafer using integrated circuit processing techniques (several suitable processing techniques are described herein). Thus, the sensor and signal processing circuitry may be provided during the manufacture of the wafer or other semiconductor structure on which they are disposed.

Of course, in some applications, it may be desirable or even necessary to provide the sensor and signal processing circuitry as separate circuits which can then be coupled to provide system 40.

It should be noted that the number of NWFETs one can place in an array of NWFETs directly translates to the spatial resolution which can be provided by the array. Thus, changing density in a non-uniform way across the surface of the sensor would result in better spatial resolution in the area of the sensor having the greatest density. For example, if a density in a center region of the sensor were higher than the density of a perimeter region of the sensor, than the center region of the sensor would provide higher spatial resolution than the perimeter.

In image processing applications, it would generally be preferred to have uniform spatial resolution across a field of view (FoV). This is achieved by having a uniform grid spacing in the sensor 42 and uniform application of the radiation sensitive material as shown in the illustrative embodiment of FIG. 3.

In other applications, however, position specific density of NWFETs and/or non-uniform application of the radiation sensitive material could be used.

Figure 4:
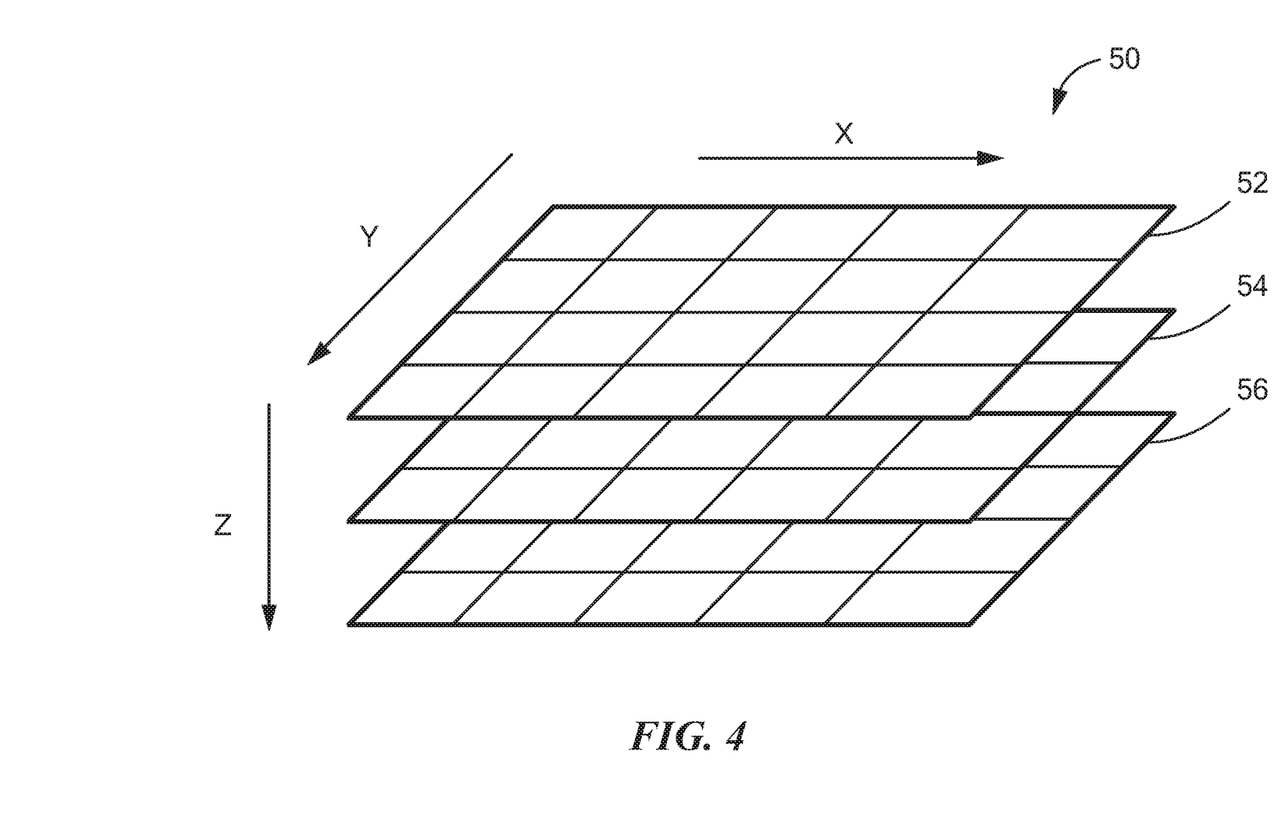
FIG. 4 is an isometric block diagram of a stack of NWFET 2D radiation sensors.

Referring now to FIG. 4, a three-dimensional (3D) radiation detection system 50 includes a stack of sensors 52, 54, 56 each of which may be the same as or similar to the sensor described above in conjunction with FIGS. 2 and 3.

Figure 5:
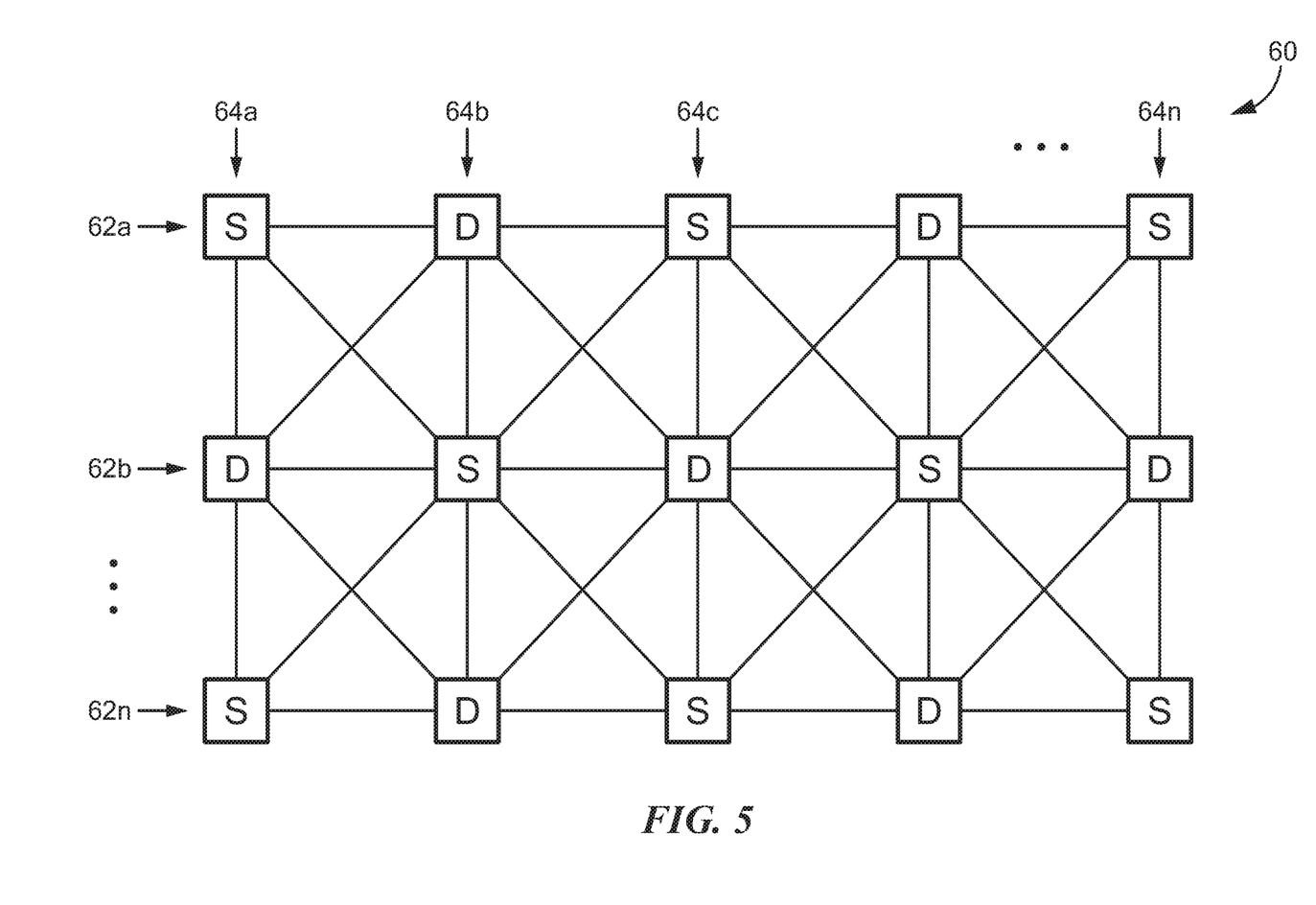
FIG. 5 is another schematic wiring diagram of an illustrative NWFET two-dimensional (2D) radiation sensor provided from a plurality of NWFET sensor elements.

Referring now to FIG. 5, an illustrative embodiment of a sensor 60 comprises an array of NWFET sensor elements which may be the same as or similar to the sensor element 10 described above in conjunction with FIG. 1. The NWFET sensor elements are defined by pairs of source and drain terminals, labeled "S" and "D" respectively in the figure. The source and drain terminals may be arranged as a grid having a plurality of rows 62a, 62b, . . . , 62n (generally denoted 62) and columns 64a, 64b, . . . , 64n (generally denoted 64). In contrast to the sensor 30 of FIG. 2, the illustrative sensor 60 of FIG. 5 includes NWFETs arranged not only vertically and horizontally, but also diagonally. In some embodiments, the source and drain terminals within two different rows 62 may be biased differently. For example, in a first row 62a, source terminals may be connected to a referenced voltage (e.g., zero volts or ground) and drain terminals may be connected to a first voltage source V, whereas in a second row 62b, source terminals may be connected to a second voltage source (e.g., V+5) and drain terminals may be connected to a third voltage source (e.g., V+10).

Figure 6:
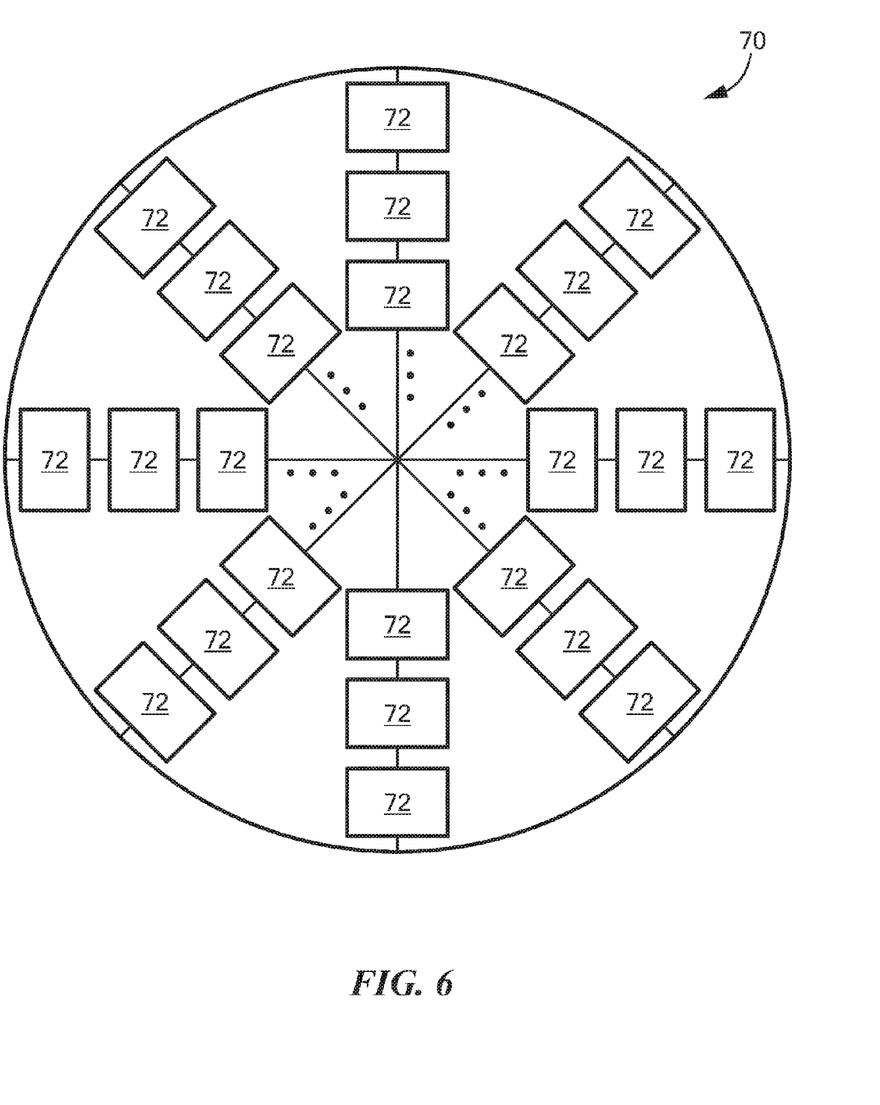
FIG. 6 is a block diagram of an embodiment of a sensor provided from a plurality of NWFET 2D radiation sensors disposed in a radial pattern.

Referring now to FIG. 6, a detector 70 is provided from an array of coupled sensors 72 disposed in a radial pattern. Each of the sensors 72 may be the same as or similar to sensors 30, 42, 50, 60 described above in conjunction with FIGS. 2-5. For example, each of the sensors 72 may be provided from an array of NWFETs with different ones of the NWFET arrays being of a different order (i.e. a different number of rows and/or columns in the NWFET array).

Figure 7:
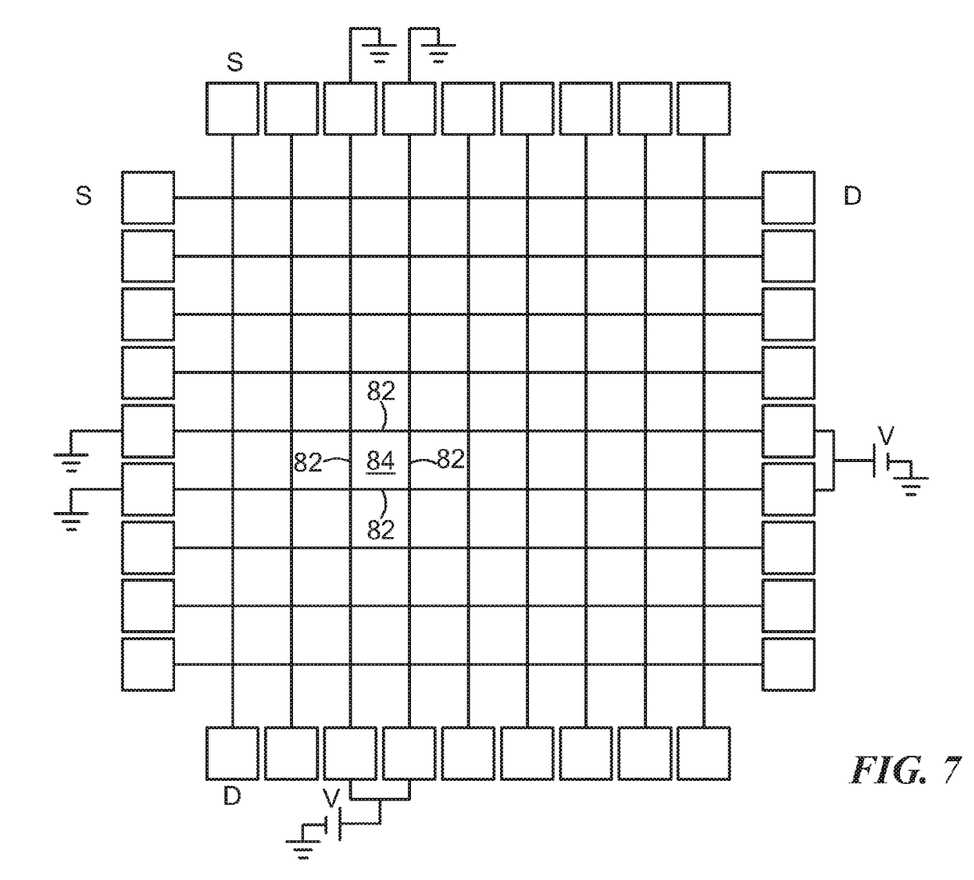
FIG. 7 is another schematic wiring diagram of an illustrative NWFET 2D radiation sensor provided from a plurality of NWFET sensor elements.

Referring to FIG. 7, an illustrative embodiment of a sensor 80 comprises an array of NWFET sensor elements, each of which may be the same as or similar to the sensor element 10 described above in conjunction with FIG. 1. Each of the NWFETs is provided having source (S), drain (D) and gate (G) terminals. A first reference potential V, is coupled to drain terminals and a second reference potential, here corresponding to ground, is coupled to the source terminals. To promote clarity in FIG. 7, the gate terminals and associated voltages are not shown, nor is the radiation sensitive material explicitly shown. In addition, only some of source/drain terminals are shown connected to the first/second reference potentials in FIG. 7.

In the embodiment of FIG. 7, the NWFETs are arranged in a rectangular network having a plurality of parallel nanowires arranged horizontally (i.e., across the page) and a plurality of parallel nanowires arranged vertically (i.e., from top-to-bottom of the page). As opposed to the sensor 30 of FIG. 2 where source/drain terminals of one NWFET sensor element may be connected to a drain/source terminal of another NWFET sensor element, in FIG. 7 each source/drain is coupled to exactly one nanowire and parallel terminals are not connected to each other. Thus, each row/column of the array shown in FIG. 7 corresponds to a single NWFET. In various embodiments, horizontal and vertical nanowires may cross each other to form nodes. Likewise, horizontal and diagonal nanowires, and vertical and diagonal nanowires may cross each other to form nodes.

Nanowires 82 are coupled between the source and drain terminals. The NWFETs thus form a two-dimensional (2D) array (i.e. a planar array) to provide a 2D radiation sensor. The area enclosed four pairs of nanowires—two parallel nanowires in a first direction and two parallel nanowires in a second direct perpendicular to the first direction—are referred to herein as an "imaging pixel" and denoted 84 in the figure. To promote clarity in the figure, only four nanowires 82 and one imaging pixel 84 are labeled. It will be appreciated that, in contrast to the design of FIG. 2, the sensor 80 has its source and drain terminals outside the field of view. In some embodiments, this results in improved sensitivity.

Although the radiation sensitive material is not explicitly shown in FIG. 7, it should be appreciated that radiation sensitive material is disposed over and around each of the nanowires filling up the imaging pixel area shown in FIG. 7. That is, the radiation sensitive material is disposed both on top of the nanowires and also fills the spaces between the nanowires such that radiation (e.g. sub-atomic particles) incident anywhere on the area of the imaging pixel is detected. The radiation sensitive material, FETs, and nanowires may be disposed or otherwise provided using techniques described above in conjunction with FIG. 2.

In operation of the 2D sensor, charge generated upon radiation incident upon the radiation sensitive material induces an electrical response in ones of the NWFETs comprising the sensor. Whenever a charge cloud is generated upon the absorption of radiation, the nodes of the NWFET array that are closer to the point of absorption will sense a higher charge density and thus will change their conductance. This change in conductance can be observed electrically as an induced increase or decrease in the electric current across each NWFET. Consequently, the position of the radiation absorption can be determined by which NWFETs have shown a change in their conductance. The accuracy of this position localization can be regulated by the distance between the NWFETs within the NWFET array.

Figure 8:
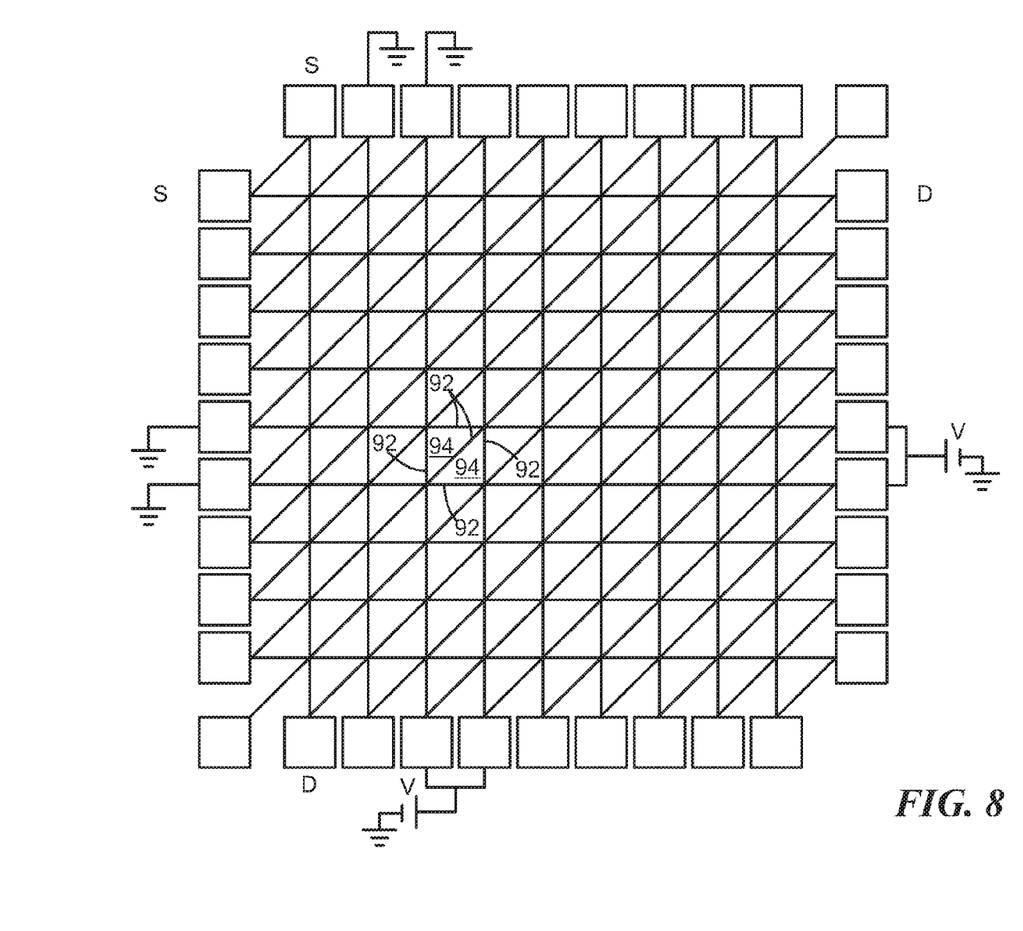
FIG. 8 is another schematic wiring diagram of an illustrative NWFET 2D radiation sensor provided from a plurality of NWFET sensor elements.

Referring now to FIG. 8, an illustrative embodiment of a sensor 90 comprises an array of NWFET sensor elements, each of which may be the same as or similar to the sensor element 10 described above in conjunction with FIG. 1. Each of the NWFETs is provided having source (S), drain (D) and gate (G) terminals. A first reference potential V, is coupled to drain terminals and a second reference potential, here corresponding to ground, is coupled to the source terminals. To promote clarity in FIG. 8, the gate terminals and associated voltages are not shown, nor is the radiation sensitive material explicitly shown. In addition, only some of drain/source terminals are shown connected to the first/second reference potentials in FIG. 8.

In the embodiment of FIG. 8, the nanowires 92 are arranged horizontally (i.e., across the page), vertically (i.e., from the top-to-bottom of the page), and diagonally. Each source and drain terminal is coupled to two nanowires 92: a diagonal nanowire, and either a horizontal or a vertical nanowire. In various embodiments, horizontal and vertical nanowires may cross each other to form nodes. Likewise, horizontal and diagonal nanowires, and vertical and diagonal nanowires may cross each other to form nodes. The addition of diagonal nanowires may result in improved sensitivity and spatial resolution. In certain embodiments, a sensor may include diagonal nanowires in both directions: from bottom left to top right as in FIG. 8, as well as from bottom right to top left.

The NWFETs form a two-dimensional (2D) array (i.e. a planar array) to thus provide a 2D radiation sensor. Each triangular area enclosed by a horizontal, a vertical, and a diagonal nanowire may be referred to as an "imaging pixel" (denoted 94 in the figure). To promote clarity in the figure, only four nanowires 92 and only two imaging pixels 94 are labeled.

Although the radiation sensitive material is not explicitly shown in FIG. 8, it should be appreciated that radiation sensitive material is disposed over and around each of the nanowires filling up the imaging pixel area shown in FIG. 8. That is, the radiation sensitive material is disposed both on top of the nanowires and also fills the spaces between the nanowires such that radiation (e.g. sub-atomic particles) incident anywhere on the area of the imaging pixel is detected. The radiation sensitive material, FETs, and nanowires may be disposed or otherwise provided using techniques described above in conjunction with FIG. 2.

In operation of the 2D sensor, charge generated upon radiation incident upon the radiation sensitive material induces an electrical response in ones of the NWFETs comprising the sensor. Whenever a charge cloud is generated upon the absorption of radiation, the nodes of the NWFET array that are closer to the point of absorption will sense a higher charge density and thus will change their conductance. This change in conductance can be observed electrically as an induced increase or decrease in the electric current across each NWFET. Consequently, the position of the radiation absorption can be determined by which NWFETs have shown a change in their conductance. The accuracy of this position localization can be regulated by the distance between the NWFETs within the NWFET array.

The concepts, circuits, systems and techniques described herein find broad applicability in the medical imaging industry. Specifically, the conceived detector can be used in imaging systems that are based upon the detection of radiation, such as autoradiography, positron emission tomography (PET), single photon emission computer tomography (SPECT), x-ray computer tomography (CT). In addition, the detector is appropriate for use in image guided intervention procedures such as biopsy and surgery. Both clinical and pre-clinical (small animal) applications are relevant. Other applications include high energy physics detectors, homeland security, and space exploration.

It should be appreciated that portions of the processing described herein may be performed by circuits, such as a digital signal processor circuit, an application specific integrated circuit (ASIC), a field programmable gate array (FPGA), or conventional electrical or electronic systems or circuits. Some processing may be manually performed, while other processing blocks may be performed by circuitry and/or one or more processors. It should be noted that unless otherwise indicated herein, the particular sequences or processes described are illustrative only and can be varied without departing from the spirit of the concepts described and/or claimed herein. Thus, unless otherwise stated, the processes described are unordered meaning that, when possible, the sequences described can be performed in any convenient or desirable order.

While particular embodiments of concepts, systems, circuits and techniques have been shown and described, it will be apparent to those of ordinary skill in the art that various changes and modifications in form and details may be made therein without departing from the spirit and scope of the concepts, systems and techniques described herein. For example, some of the presented implementation examples show a system with an array of equally spaced NWFETs. It will be appreciated that the concepts described herein can be used in systems which include a plurality of NWFETS which are not equally spaced.

The radiation sensitive material is ideally selected depending upon the particular type of particles sought to be detected (e.g. electrons, gamma rays, x-rays, other charge particles). That is, the particular type of radiation sensitive material selected for use in a sensor depends, at least in part, upon the particular type of particles to be imaged. In imager applications, for example, it would be desirable to image electrons, gamma rays, x-rays, other charge particles. In other applications, it may be desirable to image visible light while in still other applications (e.g. for space applications or nuclear energy applications) it may be desirable to detect elementary particles.

Having described preferred embodiments which serve to illustrate various concepts, systems circuits and techniques, which are the subject of this patent, it will now become apparent to those of ordinary skill in the art that other embodiments incorporating these concepts, systems circuits and techniques may be used. For example, it should be noted that individual concepts, features (or elements) and techniques of different embodiments described herein may be combined to form other embodiments not specifically set forth above. Furthermore, various concepts, features (or elements) and techniques, which are described in the context of a single embodiment, may also be provided separately or in any suitable sub-combination. It is thus expected that other embodiments not specifically described herein are also within the scope of the following claims.

In addition, it is intended that the scope of the present claims include all other foreseeable equivalents to the elements and structures as described herein and with reference to the drawing figures. Accordingly, the subject matter sought to be protected herein is to be limited only by the scope of the claims and their equivalents.

It should thus be appreciated that elements of different embodiments described herein may be combined to form other embodiments which may not be specifically set forth herein. Various elements, which are described in the context of a single embodiment, may also be provided separately or in any suitable subcombination. Other embodiments not specifically described herein are also within the scope of the following claims.

It is felt, therefore that the concepts, systems, circuits and techniques described herein should not be limited by the above description, but only as defined by the spirit and scope of the following claims which encompass, within their scope, all such changes and modifications.

All publications and references cited herein are expressly incorporated herein by reference in their entirety.

What is claimed is:

1. A sensor comprising:
a substrate;
an array of nanowire field effect transistors (NWFETs) formed in said substrate, each of the NWFETs having source, drain, frontside gate and backside gate terminals;
a nanowire coupled between the source terminal and the drain terminal of each NWFET; and
a layer of radiation sensitive material disposed over said NWFETs and said nanowires with each of the source, drain and gate terminals configured to be coupled to respective ones of first, second or third reference potentials, wherein each NWFET is configured such that the conductivity between the source and drain changes in response to radiation absorbed in the layer of radiation sensitive material such that the sensor generates an output signal in response to radiation absorbed by the radiation sensitive material.

2. The sensor of claim 1 wherein each NWFET in the array of NWFETs is coupled to at least one other NWFET in the array of NWFETs.

3. The sensor of claim 2 wherein at least one of the NWFETs in said array of NWFETs includes a drain terminal coupled to a source terminal of at least one other NWFET in said array of NWFETs.

4. The sensor of claim 1 wherein the radiation sensitive material is provided as one of:
materials sensitive to gamma rays;
materials sensitive to x-rays;
materials sensitive to charged particles; and
materials sensitive to visible light.

5. The sensor of claim 1 where the radiation sensitive material is selected depending upon the particular type of radiation particles sought to be detected.

6. The sensor of claim 1 wherein the radiation sensitive material is provided from one of: titanium oxide (TiO); titanium dioxide ($TiO_2$); dititanium trioxide ($Ti_2O_3$); lead zirconate titanate ($Pb[Zr_xTi_{1-x}]O_3$ ($0 \leq x \leq 1$); bismuth (Bi); lead (Pb); gold; tungsten; platinum; and germanium; scintillation materials.

7. The sensor of claim 1 wherein the nanowires have a diameter in the range of about 2 nanometers to about 500 nm and a length in the range of about 0.5 micron to about 30 microns.

8. The sensor of claim 1 comprising a voltage input terminal and a ground terminal, wherein the drain terminal of each of the NWFETs is coupled to the voltage input terminal and the source terminal of at least one of the NWFETs is coupled to the ground terminal.

9. The sensor of claim 1 wherein the nanowires of said array of NWFETs are disposed so as to form a rectangular grid pattern.

10. The sensor of claim 1 wherein the nanowires of said array of NWFETs are disposed horizontally, vertically, and diagonally.

11. The sensor of claim 1 wherein the array of nanowire FETs are provided in a radial pattern.

12. The sensor of claim 1 wherein the layer of radiation sensitive material corresponds to a first layer of radiation sensitive material and the array of NWFETs corresponds to a first array of NWFETs and wherein the sensor further comprises a second layer of radiation sensitive material and a second array of NWFETs with the first layer of radiation sensitive material and the first array of NWFETs disposed above the second layer of radiation sensitive material and the second array of NWFETs so as to form a stacked arrangement.

13. The sensor of claim 1 further comprising signal processing circuitry coupled to receive an output signal from the sensor.

14. The sensor of claim 1 wherein the substrate is flexible.

15. An imaging system comprising:
a radiation sensor including an array of nanowire field effect transistors (FETs), wherein each of the nanowire FETs is configured to have a layer of radiation sensitive material disposed thereunder and to have the layer of radiation sensitive material disposed thereover, and each of the nanowire FETs configured to generate an output signal in response radiation absorbed by the radiation sensitive material; and
a signal processor coupled to said radiation sensor and configured to process the nanowire FET output signals to generate an image in response to radiation incident on the radiation sensitive material.

16. The imaging system of claim 15 wherein in response to radiation absorbed by the radiation sensitive material, the conductivity between the source and drain terminals of at least one FET in the array of nanowire FETs changes from a first impedance to a second different impedance.

17. A sensor comprising:
a substrate having first and second opposing surfaces;
a layer of radiation sensitive material disposed over at least one of the first and second surfaces;
a plurality of nanowire field effect transistors (NWFETs), each of the NWFETs having drain, source and gate terminals and a nanowire coupled between the source terminal and the drain terminal, each of the NWFETs disposed on said layer of radiation sensitive material and configured to form an array of NWFETs such that in response to radiation absorbed by the radiation sensitive material, at least one NWFET in the array of NWFETs switches from a first state to a second state.

18. The sensor of claim 17 wherein in response to an amount of radiation absorbed by the layer of radiation sensitive material, the conductivity of each of the at least one of NWFET in the array of NWFETs in the first state is different than the conductivity of each of the at least one of NWFET in the array of NWFETs in the second state.

19. A sensor comprising:
a substrate;
an array of nanowire field effect transistors (NWFETs) formed in said substrate, each of the NWFETs having source, drain, and gate terminals;
a nanowire coupled between the source terminal and the drain terminal of each NWFET; and
a layer of radiation sensitive material disposed over and around said NWFETs and said nanowires with each of the source, drain and gate terminals configured to be coupled to respective ones of first, second or third reference potentials, wherein each NWFET is configured such that the conductivity between the source and drain changes in response to radiation absorbed in the layer of radiation sensitive material such that the sensor generates an output signal in response to radiation absorbed by the radiation sensitive material;
wherein the layer of radiation sensitive material corresponds to a first layer of radiation sensitive material and the array of NWFETs corresponds to a first array of NWFETs and wherein the sensor further comprises a second layer of radiation sensitive material and a second array of NWFETs with the first layer of radiation sensitive material and the first array of NWFETs disposed above the second layer of radiation sensitive material and the second array of NWFETs so as to form a stacked arrangement.

\* \* \* \* \*